United States Patent
Yamashiro et al.

[11] Patent Number: 6,046,692
[45] Date of Patent: Apr. 4, 2000

[54] MICROPROCESSOR EQUIPPED WITH AN A/D CONVERTER

[75] Inventors: Kiyomi Yamashiro; Hiroko Aikawa, both of Kanagawa, Japan

[73] Assignee: NEC Corporation, Tokyo, Japan

[21] Appl. No.: 08/898,959

[22] Filed: Jul. 23, 1997

[30] Foreign Application Priority Data

Oct. 8, 1996 [JP] Japan ..................................... 8-267439

[51] Int. Cl.[7] ............................ H03M 1/12; G06F 15/16
[52] U.S. Cl. ........................................ 341/155; 395/200.3
[58] Field of Search .................................... 341/155, 156; 395/200.3, 821

[56] References Cited

U.S. PATENT DOCUMENTS

| | | | |
|---|---|---|---|
| 3,581,304 | 5/1971 | Paradise | 340/347 |
| 3,976,831 | 8/1976 | Danell et al. | 178/6.8 |
| 4,366,469 | 12/1982 | Michaels et al. | 341/155 |
| 5,432,949 | 7/1995 | Baba | 395/800 |

FOREIGN PATENT DOCUMENTS

| | | |
|---|---|---|
| 64-8730 | 5/1989 | European Pat. Off. . |
| 4-274618 | 9/1992 | Japan . |
| 8-8746 | 1/1996 | Japan . |
| 8-186494 | 7/1996 | Japan . |

OTHER PUBLICATIONS

Burton et al.; Analog Devices; Microprocessor Systems Handbook; pp. 60–71, 74–83, 155–162, Oct. 1977.

*Primary Examiner*—Brian Young
*Assistant Examiner*—Peguy JeanPierre
*Attorney, Agent, or Firm*—Whitham, Curtis & Whitham

[57] ABSTRACT

A microprocessor which can be used as a microprocessor with 8-bit A/D converter or 10-bit A/D converter is disclosed. Voltage comparator 2 compares the analog input signal AIN level with the reference voltage VREF, and then generates the comparative signal CP. The comparative signal CP is supplied to the serial conversion register 3 in order and is stored as the converted data DC. The upper 8 bits of the converted data DC stored in the serial conversion register 3 are supplied to the conversion result register 4A, and the lower 2 bits are supplied to the conversion result register 5A. In this way, in the case where this microprocessor is used as an microprocessor with a built-in 8-bit A/D converter, the microprocessor only ignores the contents of the conversion result register 5A.

14 Claims, 4 Drawing Sheets

MICROPROCESSOR EQUIPPED WITH AN A/D CONVERTER

BACKGROUND OF THE INVENTION

The present invention relates to a microprocessor and, in particular, relates to a microprocessor equipped with an A/D converter.

At present, as A/D converters built into 8-bit single-chip microprocessors, 8-bit A/D converters are the most popular in terms of accuracy. However, in such applications requiring more accurate control as battery charger control, for example a rechargeable cadmium battery control, more accurate control is required to the microprocessor such as 10-bit A/D converting. To satisfy such requirement, it is economically inefficient to develop microprocessors equipped with 10-bit A/D converters separately from microprocessors equipped with 8-bit A/D converters. In this connection, the development of an microprocessor with a 10-bit A/D converter is desirable, in which it has 8-bit A/D converting mode and 10-bit A/D converting mode and possible to select them.

SUMMARY OF THE INVENTION

It is therefore an object of this present invention to provide an microprocessor equipped with an A/D converter converting a variable bit lengths.

The microprocessor according to the present invention comprises an N-bit bus, a first register coupled to the N-bit bus, a second register coupled to the N-bit bus, and an A/D converter for converting an analog input signal into digital converted M-bit data. Each of the N and M is integer, the M being greater than N, the first register storing upper N bits of the digital converted M-bit data, the second register storing lower M-N bits of the digital converted M-bit data. Then, the upper N-bit of the digital converted M-bit data stored into the first register and said lower M-N bits of the digital converted M-bit data stored into the second register are transferred to the N-bit bus in order when the microprocessor is used as a microprocessor equipped with M-bit A/D converter. On the other hand, the upper N-bit of the digital converted M-bit data stored into the first register are transferred to the N-bit bus without transferring the lower M-N bits of the digital converted M-bit data stored into the second register when the microprocessor is used as a microprocessor equipped with N-bit A/D converter.

Accordingly, it is not required that software processing to add the data separately stored in the first and second registers to obtain the A/D converted data. Thus, the A/D converted data is obtained immediately.

BRIEF DESCRIPTION OF THE DRAWINGS

The above and other objects, advantages and feature of the present invention will be more apparent from the following description taken in conjunction with the accompanying drawings, in which.

DETAILED DESCRIPTION OF THE PREFERRED EMBODIMENTS

Figure 3:
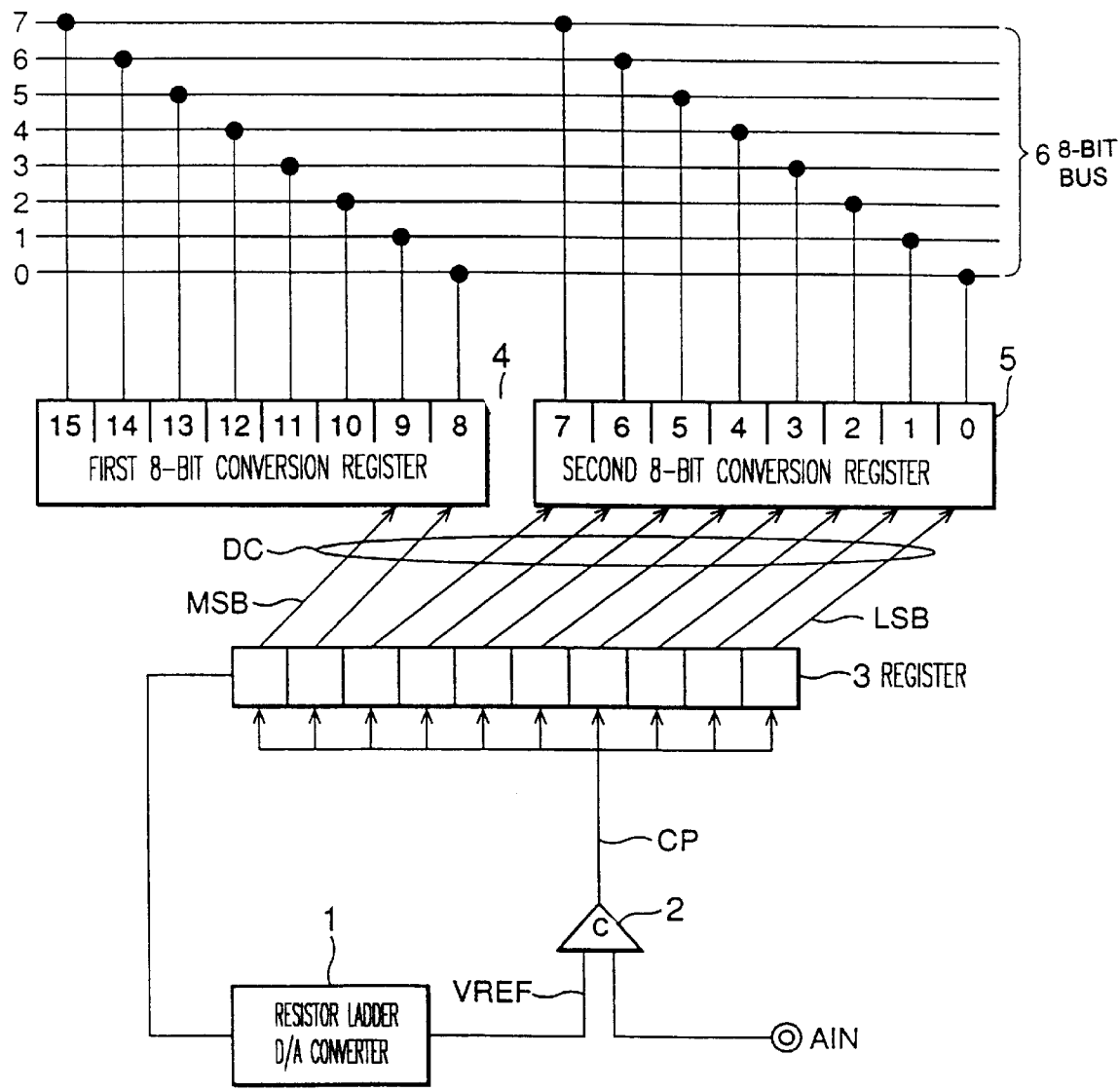
FIG. 3 shows a microprocessor equipped with an A/D converter in order to facilitate the understanding of the present invention.
Figure 4:
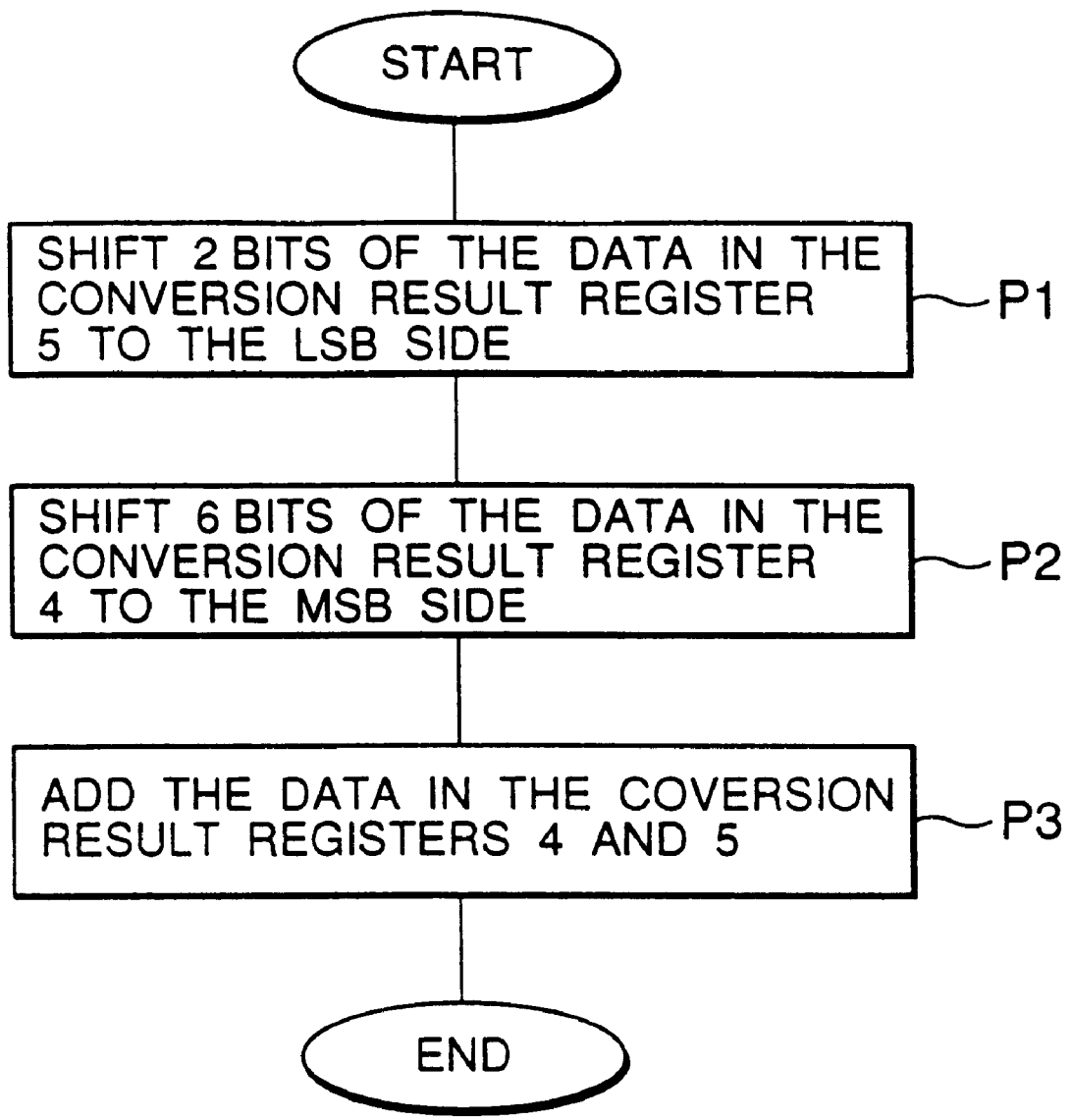
FIG. 4 is a flow chart showing 10-bit A/D converting operation using a software by the microprocessor as shown in FIG. 3.

The following examples as shown in FIG. 3 and FIG. 4 are provided to facilitate the understanding of the present invention before describing the embodiments of the present invention.

The microprocessor in FIG. 3 includes a resistor ladder type D/A converter 1 generating a reference voltage VREF, a voltage comparator 2 comparing a potential between an input analog signal AIN and the reference voltage VREF to generate a comparative signal CP, and a 10-bit serial conversion register 3 storing the comparative signal CP one bit by one bit in order. The input analog signal AIN is an analog signal to be converted to an digital signal. The microprocessor further includes a first 8-bit conversion result register 4, a second 8-bit conversion result register 5, and an internal 8-bit bus 6. The internal 8-bit bus 6 is connected to the conversion result registers 4 and 5, and also connected to an executing unit, a decoder, I/O port, and other units (not shown) in the microprocessor to transfer data or address information.

The 8-bit conversion result registers 4 and 5 store the upper 2 bits and lower 8 bits of the converted data stored in the serial conversion register 3, respectively. The internal 8-bits bus 6 transfer the data in the conversion result registers 4 and 5.

The operation of the microprocessor in FIG. 3 will now be described.

First, when the input analog signal AIN is supplied, the voltage comparator 2 compares the input analog signal AIN with the reference voltage VREF from the D/A converter 1, and the result of the comparison is stored into the serial conversion register 3. In this way, the digital converted data DC obtained by A/D conversion is stored in the serial conversion register 3. The digital converted data DC is then copied into the conversion result registers 4 and 5 in which the lower 8 bits of the digital converted data DC are stored into the conversion result register 5 and the upper 2 bits of the digital converted data DC are stored into the conversion result register 4.

Next, the data processing method of the microprocessor shown in FIG. 3 is explained, in which the 10-bit A/D converter is used as the 8-bit A/D converter. In this case, since the 10-bit A/D converter is used in 8-bit accuracy, the lower 2 bits of the serial conversion register 3 are, in effect, invalid. Thus, the data stored in bit positions 0 and 1 of the conversion result register 5 are masked either by hardware or software. As for the significant 8 bits in the serial conversion register 3, the upper 2 bits are stored in the conversion result register 4, while the lower 6 bits are stored in the conversion result register 5, separately. In order to obtain the A/D converted 8-bit data, it is therefore necessary that data from the registers 4 and 5 are added by a software procedure.

Referring now to FIG. 4, the masking procedure that is performed by software is explained. First, in step P1, data stored in the conversion result register 5 is shifted to the LSB side by 2 bits, and this shifted data is saved in a temporary register (not shown). In step P2, the data stored in the conversion result register 4 is shifted to the MSB side by 6 bits. In step P3, the contents of the shifted conversion result registers 4 and 5 are finally added to form 8-bit data.

In the case of an ordinary 8-bit microprocessor, in which such shift operations perform one bit by one bit, approximately 10 shift instructions are required to carry out above mentioned adding procedure by software. This would slow down user applications since this software process must be performed at every A/D conversion.

Figure 1:
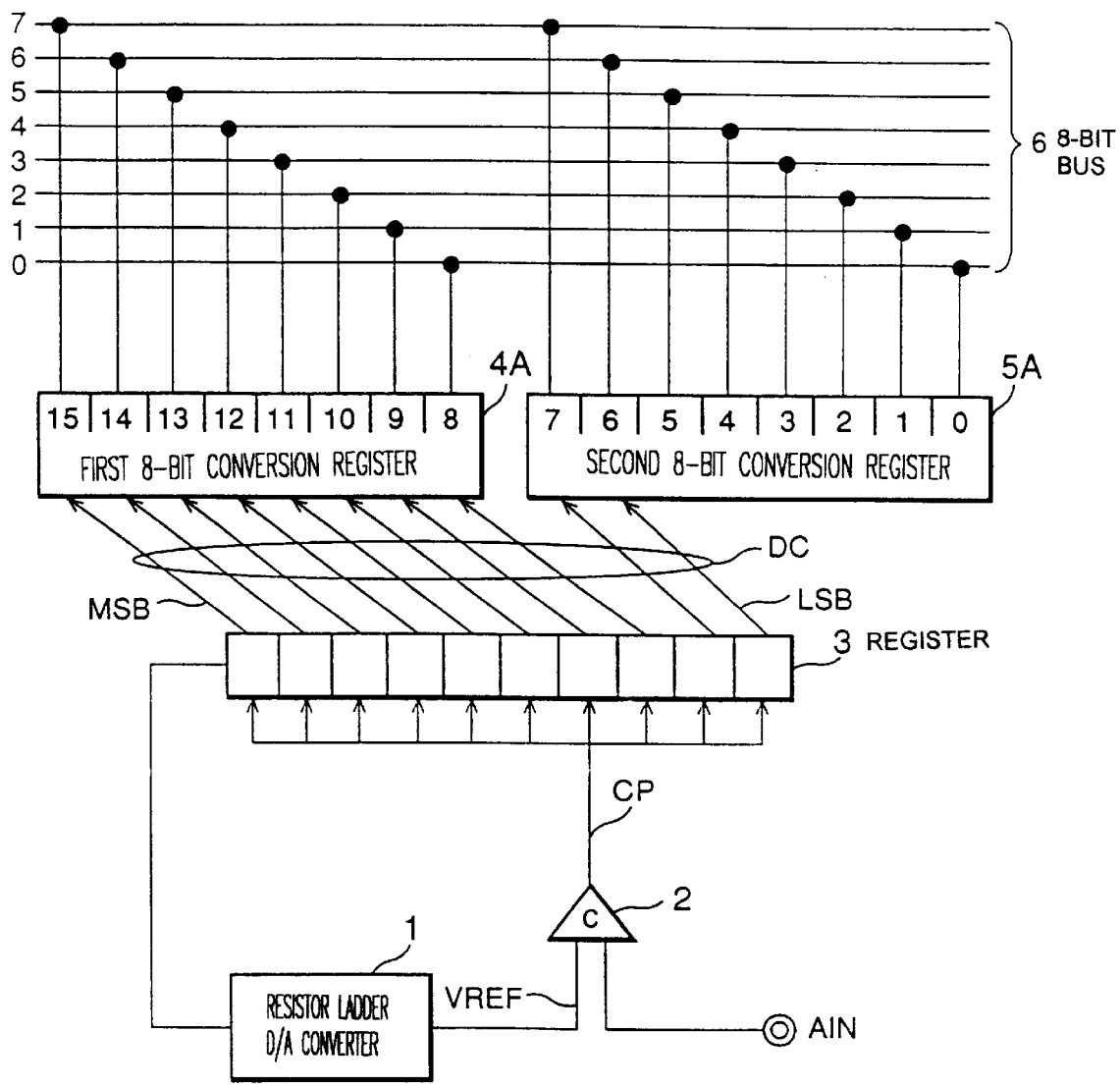
FIG. 1 shows a microprocessor according to one embodiment of the present invention equipped with an A/D converter.

Turning to FIG. 1, the microprocessor equipped with A/D converter of the preferred embodiment of the present invention will now be explained. The microprocessor includes an A/D converter having a resistor ladder type D/A converter 1 generating a reference voltage VREF, a voltage comparator 2 comparing a potential between an input analog signal AIN and the reference voltage VREF to generate a comparative signal CP, and a 10-bit serial conversion register 3 storing the comparative signal CP one bit by one bit in order. The input analog signal AIN is an analog signal to be converted to an digital signal. The microprocessor further includes a first 8-bit conversion result register 4A, a second 8-bit conversion result register 5A, and an internal 8-bit bus 6. The internal 8-bit bus 6 is coupled to the conversion result registers 4A and 5A, and also coupled to an executing unit, a decoder, I/O port, and other units (not shown) in the microprocessor to transfer data or address information.

The 8-bit conversion result registers 4A and 5A store the upper 2 bits and lower 8 bits of the converted data stored in the serial conversion register 3, respectively. The internal 8-bits bus 6 transfer the data in the conversion result registers 4A and 5A.

Next, the operation of the microprocessor will now be explained.

The D/A converter 1 comprises a resistor ladder and switches, and generates the reference analog voltage VREF serially. First, in order to determine whether a potential of the analog input signal AIN is more than 10000 . . . or less than 01111 . . . , the D/A converter 1 supplies the voltage comparator 2 with a first intermediate voltage.

The voltage comparator 2 then compares the first intermediate voltage with the input analog signal AIN, and if the level of the analog input signal AIN is higher than the first intermediate voltage, the logical value "1" is stored into the most significant bit (MSB) position of the serial conversion register 3. On the other hand, if the level of the input analog signal AIN is lower than the first intermediate voltage, the logical value "0" is stored as the MSB of the serial conversion register 3.

Next, if the logical value "1" was stored into the MSB position of the serial conversion register 3, in order to determine whether the analog input signal AIN to be converted to digital form is more than 11000 . . . or less than 10111 . . . , the D/A converter 1 supplies a second intermediate level voltage to the voltage comparator 2.

On the other hand, if the logical value "0" was stored into the MSB of the serial conversion register 3, in order to determine whether the analog input signal AIN is more than 01000 . . . or less than 00111 . . . , the D/A converter 1 supplies a third intermediate level voltage to the voltage comparator 2.

In this manner, the analog input signal AIN and the reference voltage VREF are compared serially until the 10-bit accurate digital converted data DC is obtained. As shown in FIG. 1, the upper 8 bits of the digital converted data DC are stored into the conversion result register 4A and the lower 2 bits of the digital converted data DC are stored into the conversion result register 5A separately. In this embodiment, the lower 2 bits of the digital converted data DC are stored into upper 2 bit of the conversion result register 5A.

When this microprocessor is used as a microprocessor equipped with a 10-bit A/D converter, the upper 8 bits of the digital converted data DC which is stored in the conversion result register 4A are first transferred, by software processing, to the bus 6. Next, the lower 2 bits of the digital converted data DC which is stored in the conversion result register 5A are transferred to the bus 6. Then, the first transferred 8 bits and next transferred 2 bits are added by software procedure to obtain 10 bits data. In this way, the microprocessor works as an microprocessor equipped with a 10-bit A/D converter even the microprocessor has the bus 6 which is 8-bit width.

On the other hand, if the microprocessor is used as an microprocessor equipped with an 8-bit A/D converter, only the conversion result register 4A where the upper 8 bits data are stored needs to be accessed, without accessing the conversion result register 5A, where the lower 2 bits are stored. In this way, the microprocessor works as an ordinary microprocessor with a built-in 8-bit A/D converter without executing the additional software operation as described in FIG. 4.

Figure 2:
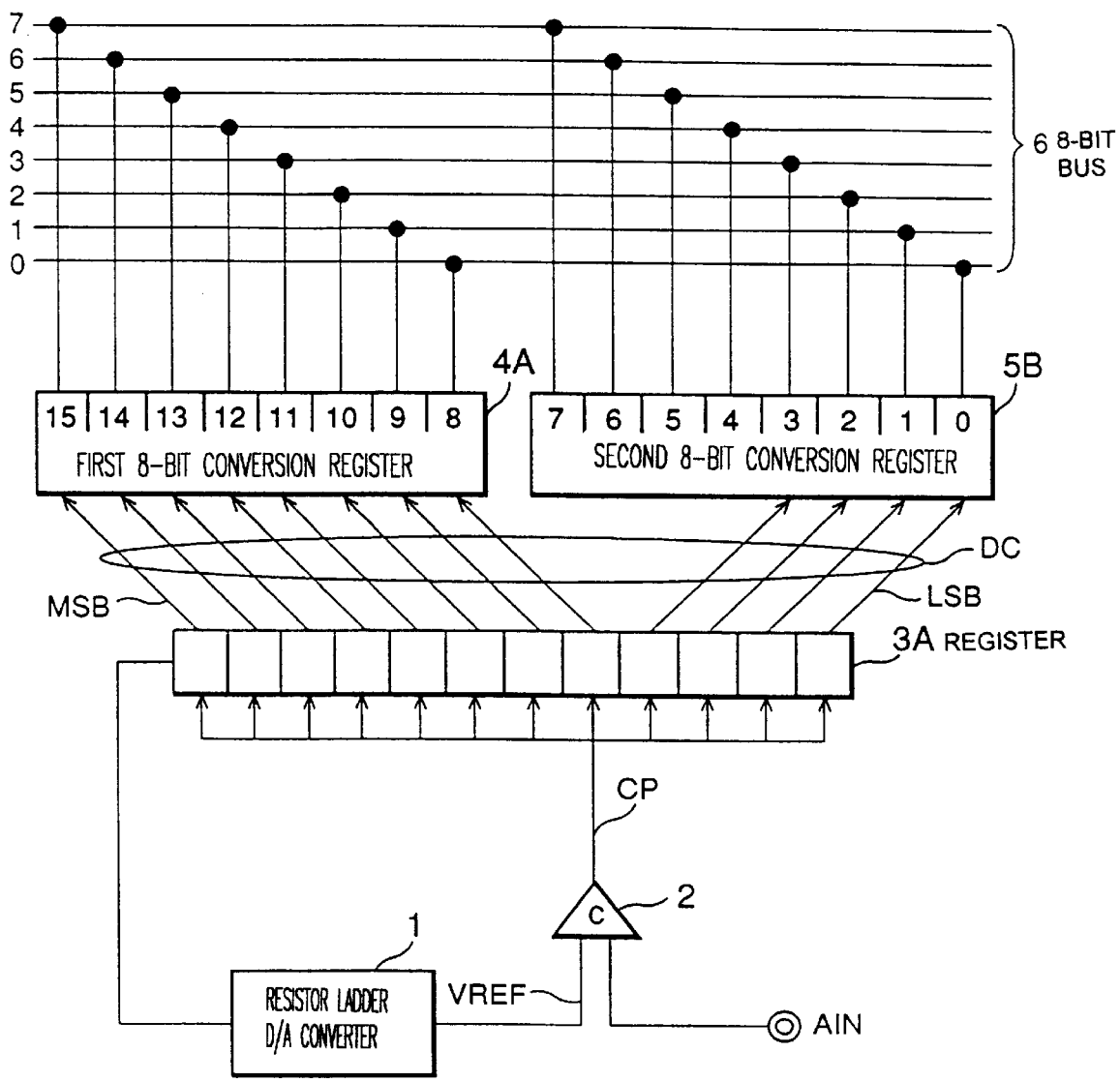
FIG. 2 shows a microprocessor according to another embodiment of the present invention equipped with an A/D converter.

Furthermore, this invention is not limited to the above embodiment. For example, as shown in FIG. 2, it is possible to use the microprocessor with a 12-bit accurate A/D converter. In this case, the serial conversion register 3A in FIG. 2 is 12-bit, and the conversion result register 5B for storing the lower bits will now store the lower 4 bits of the digital converted data DC. In this embodiment, the lower 4 bits of the digital converted data DC are stored into lower 4 bit of the conversion result register 5A. In such a configuration, the microprocessor can be used as a built-in 8-bit A/D converter by accessing only the conversion result register 4A where the upper 8 bits data are stored, without accessing the conversion result register 5B where the lower 4 bits data are stored.

As described above, in the microprocessor according to the present invention, since the upper N bits of the digital converted data is stored into the first conversion result register and the lower M-N bits of the digital converted data is stored into the second conversion result register, the N bit A/D converted data can be obtained by accessing only the contents of the first conversion result register when the microprocessor is used as the microprocessor equipped with N-bit A/D converter. Therefore, it is not required that additional software processing to add the data separately stored in the two conversion result registers to obtain the A/D converted data. Thus, the A/D converted data is obtained immediately.

According to the present invention, there is also another advantage that the any hardware or software is not required to mask the invalidated lower bits in the conversion result register where the lower bits are stored.

Further, since the additional software to add the data separately stored in the two conversion result registers is not required, development costs and the software test time are reduced.

What is claimed is:

1. A microprocessor, comprising:
   an N-bit bus.
   a first register coupled to said N-bit bus,
   a second register coupled to said N-bit bus, and
   an A/D converter for converting an analog input signal into digital data M-bits in length, each of said N and M being an integer, said M being greater than N, said first register and said second register being coupled to said A/D converter.
   wherein said first register is coupled to said A/D converter to store most significant N bits of said digital data and said second register is coupled to said A/D converter to store remaining bits of said digital data, said first register and said second register transferring, respectively, said most significant N bits and said remaining bits of said digital data from said A/D converter to said N-bit bus.

2. The microprocessor as claimed in claim 1, wherein each of said first register and said second register is N-bits in length.

3. The microprocessor as claimed in claim 1, wherein said A/D converter includes a third register storing said digital data, said third register being coupled to said first register to supply said most significant N bits of said digital data to said first register, said third register being coupled to said second register to supply said remaining bits of said digital data to said second register.

4. The microprocessor as claimed in claim 3, wherein said A/D converter further includes; a D/A converter which generates a reference voltage and a voltage comparator which compares said reference voltage and said analog input signal to generate said digital data.

5. The microprocessor as claimed in claim 4, wherein said A/D converter generates said digital data in an order from a most significant bit of said digital data to a least significant bit as a result of said voltage comparator sequentially comparing a plurality of intermediate voltages, produced from said D/A converter, with said analog input signal.

6. The microprocessor as claimed in claim 3, wherein said D/A converter serially inputs said M-bits of digital data into said third register.

7. The microprocessor as claimed in claim 1, wherein said most significant N bits of said digital data stored into said first register and said remaining bits of said digital data stored into said second register are transferred to said N-bit bus in order when said A/D converter is used as a M-bit A/D converter, said most significant N bits of said digital data stored into said first register being transferred to said N-bit bus without transferring said remaining bits of said digital data stored into said second register when the A/D converter is used as a N-bit A/D converter.

8. The microprocessor as claimed in claim 1, wherein said remaining bits are stored into a most significant M-N bits of said second register.

9. The microprocessor as claimed in claim 1, wherein said remaining bits are stored into a least significant M-N bits of said second register.

10. A method for transferring data from a D/A converter to an N-bit bus of a microprocessors, said D/A converter being located within said microprocessor, comprising:

converting an analog input signal into digital data M-bits in length using said D/A converter, where M is greater than N;

storing N most significant bits of said digital data in a first register;

storing remaining bits of said digital data in a second register;

determining a bit length of said D/A converter in accordance with steps which include:

(a) causing only said most significant N bits of said digital data to be output from said first register to said N-bit bus when said D/A converter is to operate as an N-bit D/A converter, and (b) causing said most significant N bits of said digital data to be output from said first register to said N-bit bus and then causing said remaining bits of digital data to be output from said second register to said N-bit bus when said D/A converter is to operate as an M-bit D/A converter.

11. The method as claimed in claim 10, further comprising:

storing said M-bits of digital data in a third register, said third register coupled to said first register to supply said N most significant bits of said digital data to said first register, and said third register coupled to said second register to supply said remaining bits of said digital data to said second register.

12. A method for transferring data from an M-bit D/A converter to an N-bit bus of a microprocessor, where M is greater than N, said D/A converter being located within said microprocessor, said method comprising:

converting an analog signal into N-bit digital data using said M-bit A/D converter;

storing said N-bit digital data in a conversion register;

transferring N-(M-N) least significant bits from said conversion register to an LSB register which is N-bits in length;

masking unfilled bits of said LSB register;

transferring M-N most significant bits from said conversion register to a MSB register;

adding contents of said MSB register and said LSB register to form an N-bit word; and transferring said N-bit word onto said bus.

13. The method as claimed in claim 12, further comprising:

shifting said N-(M-N) least significant bits in said LSB register to an LSB side of said LSB register by M-N bits;

saving said shifted bits in said LSB resister in a temporary register;

shifting said M-N most significant bits in said MSB register to a MSB side of said MSB register by N-(M-N) bits; and adding said shifted bits in said MSB register and the shifted bits in said temporary register to form said N-bit word.

14. A microprocessor comprising:

an N-bit bus;

a first register coupled to said N-bit bus;

a second register coupled to said N-bit bus;

an A/D converter for converting an analog input signal into digital data M-bits in length, each of said N and M being an integer, said M being greater than N, said first register being coupled to said A/D converter to store most significant N bits of said digital data, and said second register being coupled to said A/D converter to store remaining bits of said digital data; and control means for determining a bit length of said A/D converter, said control means issuing a first signal for causing only said most significant N bits of said digital data to be output from said first register to said N-bit bus, and said control means issuing a second signal for causing said most significant N bits of said digital data to be output from said first register to said N-bit bus and then for causing said remaining bits of digital data to be output from said second register to said N-bit bus.

* * * * *